United States Patent
Choi et al.

(10) Patent No.: US 10,488,485 B2
(45) Date of Patent: Nov. 26, 2019

(54) MAGNETIC RESONANCE IMAGING APPARATUS AND METHOD FOR OBTAINING MAGNETIC RESONANCE IMAGE

(71) Applicant: SAMSUNG ELECTRONICS CO., LTD., Suwon-si (KR)

(72) Inventors: Joon-sung Choi, Anyang-si (KR); Young-beom Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 113 days.

(21) Appl. No.: 15/681,018

(22) Filed: Aug. 18, 2017

(65) Prior Publication Data
US 2018/0067183 A1 Mar. 8, 2018

(30) Foreign Application Priority Data
Sep. 2, 2016 (KR) .......................... 10-2016-0113277

(51) Int. Cl.
*G01R 33/561* (2006.01)
*G01R 33/48* (2006.01)
*G01R 33/565* (2006.01)

(52) U.S. Cl.
CPC ..... *G01R 33/5615* (2013.01); *G01R 33/4818* (2013.01); *G01R 33/561* (2013.01);
(Continued)

(58) Field of Classification Search
CPC .............. G01R 33/4818; G01R 33/561; G01R 33/5618; G01R 33/56554; G01R 33/5615; G01R 33/5617
(Continued)

(56) References Cited

U.S. PATENT DOCUMENTS

| 4,764,955 A * | 8/1988 | Galand | H04B 3/23 370/290 |
| 5,539,311 A * | 7/1996 | Takiguchi | G01R 33/56554 324/306 |

(Continued)

FOREIGN PATENT DOCUMENTS

| JP | 2002253526 A | 9/2002 |
| JP | 2005317282 A | 11/2005 |

(Continued)

OTHER PUBLICATIONS

Communication dated Dec. 27, 2017, issued by the Korean Intellectual Property Office in corresponding Korean Application No. 10-2016-0113277.

(Continued)

*Primary Examiner* — Patrick Assouad
*Assistant Examiner* — Demetrius R Pretlow
(74) *Attorney, Agent, or Firm* — Sughrue Mion, PLLC

(57) ABSTRACT

A magnetic resonance imaging (MRI) apparatus for obtaining a magnetic resonance (MR) image using a multi-echo pulse sequence including a plurality of repetition times, including a memory configured to store an MR signal obtained using the multi-echo pulse sequence, and an image processor configured to determine a plurality of echo times included in the plurality of repetition times to provide the multi-echo pulse sequence including the plurality of echo times during the plurality of repetition times, and to obtain the MR image, based on the MR signal, wherein the plurality of repetition times includes a first repetition time adjacent to a second repetition time, wherein the plurality of echo times includes a first echo time of the first repetition time, a second echo time of the first repetition time, a first echo time of the second repetition time, and a second echo time of the second repetition time.

20 Claims, 12 Drawing Sheets

(52) U.S. Cl.
CPC .. *G01R 33/56518* (2013.01); *G01R 33/56554* (2013.01); *G01R 33/5618* (2013.01)

(58) Field of Classification Search
USPC .......................................................... 324/309
See application file for complete search history.

(56) References Cited

U.S. PATENT DOCUMENTS

| | | | | |
|---|---|---|---|---|
| 5,655,532 | A * | 8/1997 | Yasugi | G01R 33/482 |
| | | | | 324/309 |
| 6,541,970 | B1 * | 4/2003 | Takizawa | G01R 33/56554 |
| | | | | 324/309 |
| 8,614,574 | B2 | 12/2013 | Yokosawa et al. | |
| 9,041,394 | B2 | 5/2015 | Umeda | |
| 9,297,875 | B2 | 3/2016 | Landschuetz et al. | |
| 9,538,936 | B2 | 1/2017 | Kimura et al. | |
| 9,581,667 | B2 * | 2/2017 | Stemmer | G01R 33/5616 |
| 2002/0188190 | A1 * | 12/2002 | Kassai | A61B 5/7285 |
| | | | | 600/410 |
| 2005/0218894 | A1 * | 10/2005 | Miyawaki | G01R 33/56518 |
| | | | | 324/309 |
| 2010/0052675 | A1 * | 3/2010 | Priatna | G01R 33/561 |
| | | | | 324/309 |
| 2010/0188085 | A1 * | 7/2010 | Huo | G01R 33/4824 |
| | | | | 324/309 |
| 2010/0240984 | A1 * | 9/2010 | Fuderer | G01R 33/243 |
| | | | | 600/410 |
| 2011/0241671 | A1 * | 10/2011 | Zhao | G01R 33/4824 |
| | | | | 324/309 |
| 2013/0043868 | A1 * | 2/2013 | Hwang | G01R 33/4816 |
| | | | | 324/309 |
| 2013/0307542 | A1 * | 11/2013 | Chen | G01R 33/5613 |
| | | | | 324/318 |
| 2014/0066746 | A1 * | 3/2014 | Son | G01R 33/5602 |
| | | | | 600/410 |
| 2014/0152305 | A1 * | 6/2014 | Son | G01R 33/56563 |
| | | | | 324/309 |
| 2014/0152308 | A1 * | 6/2014 | Lee | G01R 33/246 |
| | | | | 324/309 |
| 2014/0210467 | A1 * | 7/2014 | Hwang | G01R 33/5602 |
| | | | | 324/309 |
| 2014/0300356 | A1 * | 10/2014 | Stemmer | G01R 33/5616 |
| | | | | 324/309 |
| 2015/0008921 | A1 | 1/2015 | Lee et al. | |
| 2015/0108976 | A1 * | 4/2015 | Fischer | G01R 33/5616 |
| | | | | 324/309 |
| 2016/0033607 | A1 * | 2/2016 | Sun | G01R 33/5616 |
| | | | | 324/309 |
| 2016/0041249 | A1 * | 2/2016 | Lee | G01R 33/4828 |
| | | | | 324/309 |
| 2016/0113501 | A1 * | 4/2016 | Hua | G01R 33/4806 |
| | | | | 600/420 |
| 2016/0131729 | A1 * | 5/2016 | Kang | G01R 33/50 |
| | | | | 324/309 |
| 2016/0202334 | A1 * | 7/2016 | Stehning | G01R 33/481 |
| | | | | 324/309 |
| 2016/0202338 | A1 * | 7/2016 | Kimura | G01R 33/5608 |
| | | | | 324/309 |
| 2017/0097400 | A1 | 4/2017 | Nakai | |
| 2018/0017649 | A1 * | 1/2018 | Tomoda | G01R 33/4835 |

FOREIGN PATENT DOCUMENTS

| | | |
|---|---|---|
| JP | 5236356 B2 | 7/2013 |
| JP | 5472945 B2 | 4/2014 |
| KR | 1020140121363 A | 10/2014 |
| KR | 101474757 B1 | 12/2014 |
| KR | 10-1600133 B1 | 3/2016 |
| WO | 03040733 A2 | 5/2003 |
| WO | 2015190508 A1 | 12/2015 |

OTHER PUBLICATIONS

Communication dated Mar. 6, 2018, from the European Patent Office in counterpart European Application No. 17186639.5.
Ralf Mekle et al. "Combined MR Data Acquisition of Multicontrast Images Variable Acquisition Parameters and K-Space Data Sharing" IEEE Transactions on Medical Imaging, vol. 22, No. 7, Jul. 1, 2003, (pp. 806-823) XP011099082.
X. Deligianni et al. "High-Resolution Fourier-Encoded Sub-Millisecond Echo Time Musculoskeletal Imaging at 3 Tesla and 7 Tesla" Magnetic Resonance in Medicine vol. 70, No. 5, Nov. 1, 2013, (pp. 1434-1439), XP055452431.

* cited by examiner

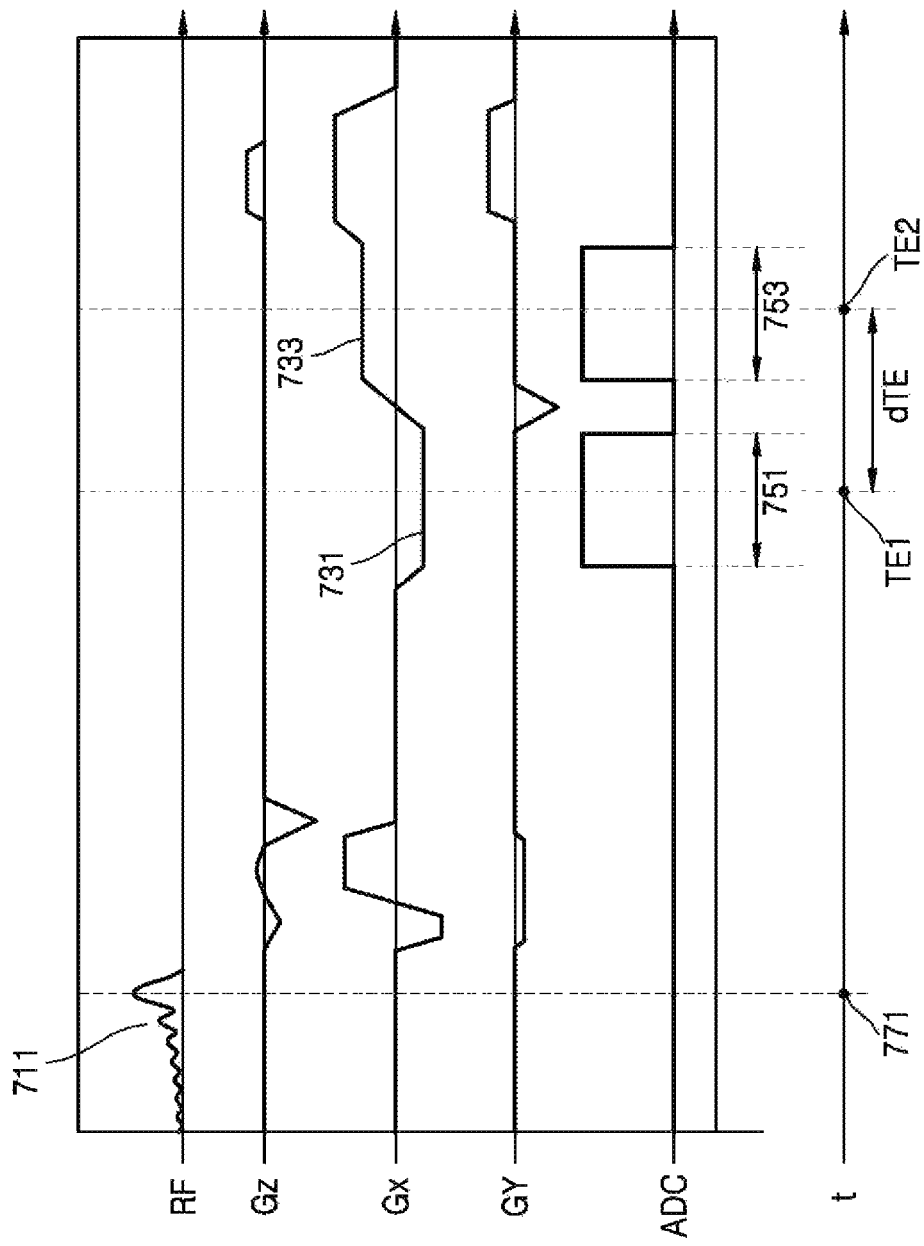

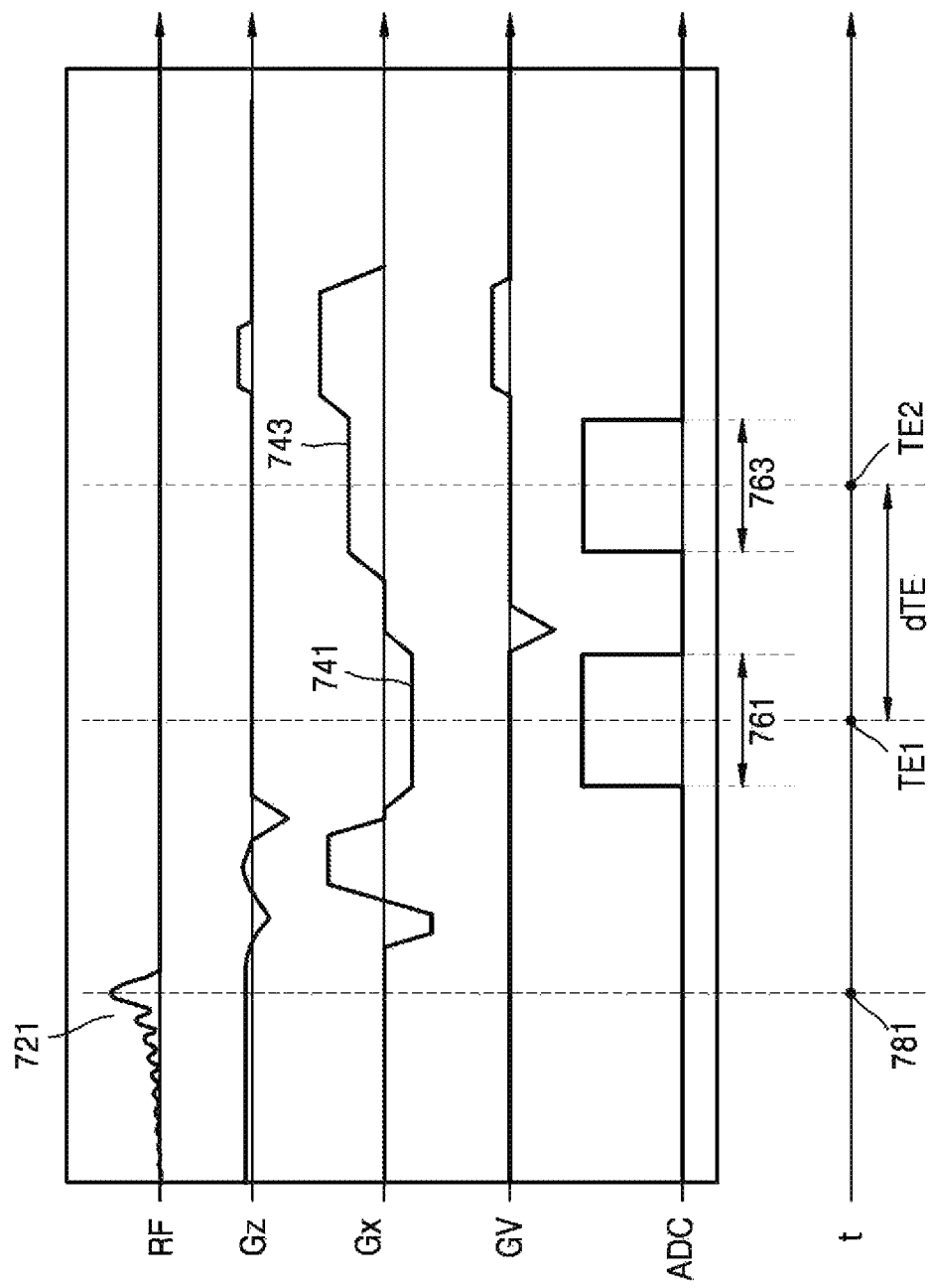

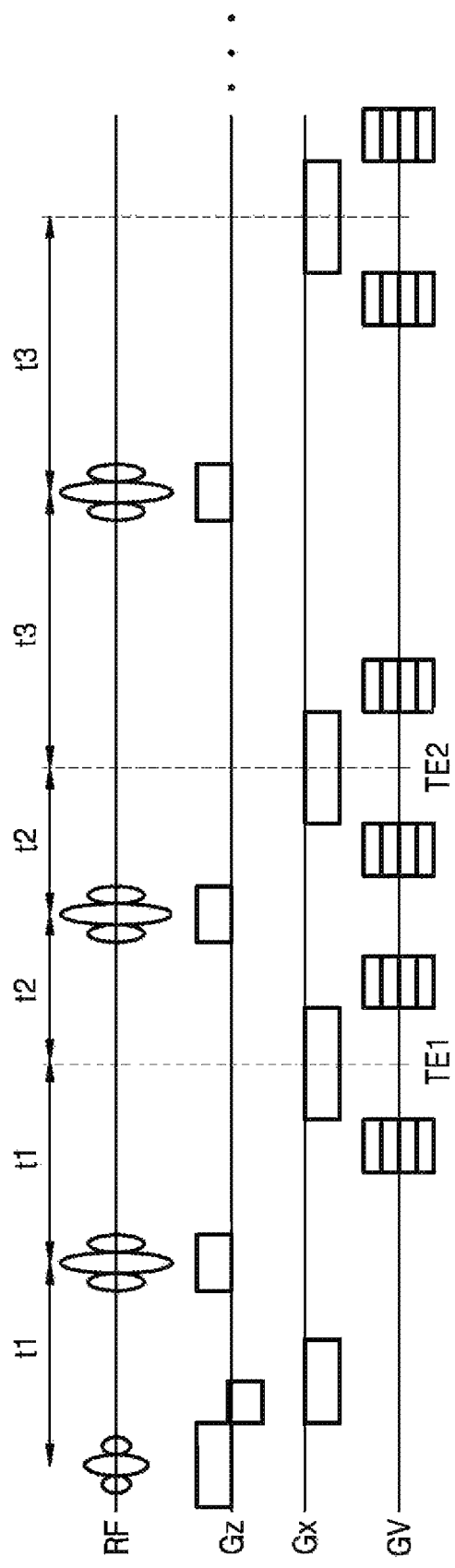

MAGNETIC RESONANCE IMAGING APPARATUS AND METHOD FOR OBTAINING MAGNETIC RESONANCE IMAGE

CROSS-REFERENCE TO RELATED APPLICATION

This application claims the benefit of Korean Patent Application No. 10-2016-0113277, filed on Sep. 2, 2016, in the Korean Intellectual Property Office, the disclosure of which is incorporated herein in its entirety by reference.

BACKGROUND

1. Field

Apparatuses and methods consistent with exemplary embodiments to a magnetic resonance imaging (MRI) apparatus and method for obtaining a magnetic resonance (MR) image, and more particularly, to an MRI apparatus for obtaining an MR image by using a multi-echo pulse sequence, and a method of obtaining the MR image.

2. Description of Related Art

A magnetic resonance imaging (MRI) apparatus uses a magnetic field to capture an image of an object. The MRI apparatus is used for accurate disease diagnosis because stereoscopic images of bones, lumbar discs, joints, nerves, ligaments, the heart, etc., can be obtained at desired angles.

In order to capture a magnetic resonance (MR) image, the MRI apparatus applies a radio frequency (RF) signal to an object and obtains an MR signal emitted from the object in response to the applied RF signal. In order to obtain a high-quality MR image, the MRI apparatus may reconstruct a motion-corrected MR image from the obtained MR signal by correcting artifacts caused by motion of the object which occurred during an MRI scan.

A multi-echo pulse sequence is used to obtain an MR signal by using a series of echoes that are generated after excitation of one RF pulse. The MRI apparatus obtains k-space data by using the multi-echo pulse sequence, thereby reducing a time period for obtaining an image.

When an image is obtained by using a multi-echo pulse sequence, phases of MR signals obtained at respective echo times in one repetition time are different from each other. Thus, due to different phase components of the MR signals, artifacts may occur in a reconstructed image.

In addition, when an image is obtained by using a multi-echo pulse sequence, if a direction of a frequency encoding gradient repeatedly changes between negative and positive polarities, artifacts may occur due to an eddy current caused by the changes in polarity.

SUMMARY

Exemplary embodiments are provided to design a pulse sequence to sequentially change an echo time in each repetition time so that a sharp change in echo times of a plurality of items of data in a k-space does not occur when an image is obtained by using a multi-echo pulse sequence.

Exemplary embodiments are also provided to reduce artifacts occurring due to different phase components of magnetic resonance (MR) signals by preventing a sharp change in echo times of a plurality of items of data in a k-space when an image is obtained by using a multi-echo pulse sequence.

Additional aspects will be set forth in part in the description which follows and, in part, will be apparent from the description, or may be learned by practice of the presented exemplary embodiments.

According to an aspect of an exemplary embodiment, a magnetic resonance imaging (MRI) apparatus for obtaining a magnetic resonance (MR) image using a multi-echo pulse sequence including a plurality of repetition times includes a memory configured to store an MR signal obtained using the multi-echo pulse sequence; and an image processor configured to determine a plurality of echo times included in the plurality of repetition times to provide the multi-echo pulse sequence including the plurality of echo times during the plurality of repetition times, and to obtain the MR image, based on the MR signal, wherein the plurality of repetition times includes a first repetition time adjacent to a second repetition time, wherein the plurality of echo times includes a first echo time of the first repetition time, a second echo time of the first repetition time, a first echo time of the second repetition time, and a second echo time of the second repetition time, wherein at least one of a value of the first echo time of the first repetition time is different from a value of the first echo time of the second repetition time, or a value of the second echo time of the first repetition time is different from a value of the second echo time of the second repetition time, and wherein a first difference value between the first echo time of the first repetition time and the second echo time of the first repetition time, is different from a second difference value between the first echo time of the second repetition time and the second echo time of the second repetition time.

The image processor may be further configured to determine the plurality of echo times by using a differential formula.

The differential formula may correspond to a function of a value of a phase encoding axis in a k-space.

The image processor may be further configured to determine a flat period including a time period in which the first echo time of the first repetition time equals the first echo time of the second repetition time, or the second echo time of the first repetition time equals the second echo time of the second repetition time, and determine a transition period including a time period in which the first echo time of the first repetition time is different from the first echo time of the second repetition time, and the second echo time of the first repetition time is different from the second echo time of the second repetition time.

The plurality of repetition times may correspond to a value of a phase encoding axis in a k-space, and the image processor may be further configured to determine the plurality of echo times to be sequentially increased or decreased according to a sequential increase in the value of the phase encoding axis.

The image processor may be further configured to determine the plurality of echo times to have irregular periods with respect to the sequential increase or decrease in the plurality of echo times.

The multi-echo pulse sequence including the plurality of repetition times may further include at least one of a gradient echo sequence, a spin echo sequence, a fast spin echo sequence, and a gradient- and spin-echo (GRASE) sequence.

First k-space data corresponding to the first echo time of the first repetition time or the first echo time of the second repetition time may correspond to a low frequency domain in a k-space, and second k-space data corresponding to the second echo time of the first repetition time or the second echo time of the second repetition time may correspond to a high frequency domain in the k-space.

The image processor may be further configured to change a length of an echo time of the plurality of echo times by controlling an intensity of a readout gradient applied to a time period corresponding to the echo time.

According to another aspect of an exemplary embodiment, a method of obtaining a magnetic resonance (MR) image by using a multi-echo pulse sequence including a plurality of repetition times includes determining a plurality of echo times included in the plurality of repetition times, providing the multi-echo pulse sequence including the plurality of echo times during the plurality of repetition times, and obtaining the MR image, based on an MR signal obtained by using the multi-echo pulse sequence, wherein the plurality of repetition times includes a first repetition time adjacent to a second repetition time, wherein the plurality of echo times includes a first echo time of the first repetition time, a second echo time of the first repetition time, a first echo time of the second repetition time, and a second echo time of the second repetition time, wherein at least one of a value of the first echo time of the first repetition time is different from a value of the first echo time of the second repetition time, or a value of the second echo time of the first repetition time is different from a value of the second echo time of the second repetition time, and wherein a first difference value between the first echo time of the first repetition time and the second echo time of the first repetition time, is different from a second difference value between the first echo time of the second repetition time and the second echo time of the second repetition time.

The determining may further include determining the plurality of echo times by using a differential formula.

The differential formula may correspond to a function of a value of a phase encoding axis in a k-space.

The method may further include determining a flat period including a time period in which the first echo time of the first repetition time equals the first echo time of the second repetition time, or the second echo time of the first repetition time equals the second echo time of the second repetition time, and determining a transition period including a time period in which the first echo time of the first repetition time is different from the first echo time of the second repetition time, and the second echo time of the first repetition time is different from the second echo time of the second repetition time.

The plurality of repetition times may correspond to a value of a phase encoding axis in a k-space, and the determining may include determining the plurality of echo times to be sequentially increased or decreased according to a sequential increase in the value of the phase encoding axis.

The determining may include determining the plurality of echo times to have irregular periods with respect to the sequential increase or decrease in the plurality of echo times.

The multi-echo pulse sequence including the plurality of repetition times may further include at least one of a gradient echo sequence, a spin echo sequence, a fast spin echo sequence, and a gradient- and spin-echo (GRASE) sequence.

First k-space data corresponding to the first echo time of the first repetition time or the first echo time of the second repetition time may correspond to a low frequency domain in a k-space, and second k-space data corresponding to the second echo time of the first repetition time or the second echo time of the second repetition time may correspond to a high frequency domain in the k-space.

The method may further include changing a length of an echo time of the plurality of echo times by controlling an intensity of a readout gradient applied to a first time period corresponding to the echo time.

According to another aspect of an exemplary embodiment, a computer-readable recording medium may have recorded thereon a program for executing the methods described herein.

According to another aspect of an exemplary embodiment, a method of obtaining a magnetic resonance (MR) image by using a multi-echo pulse sequence including a plurality of repetition times includes determining a plurality of echo times included in the plurality of repetition times, providing the multi-echo pulse sequence including the plurality of echo times during the plurality of repetition times, and obtaining the MR image, based on an MR signal obtained by using the multi-echo pulse sequence, wherein the plurality of repetition times includes a first repetition time adjacent to a second repetition time, wherein the first repetition time includes a first echo time and a second echo time, and the second repetition time includes a third echo time and a fourth echo time, wherein at least one of a value of the first echo time is different from a value of the third echo time, or a value of the second echo time is different from a value of the fourth echo time, and wherein a first difference value between the first echo time and the second echo time, is different from a second difference value between the third echo time and the fourth echo time.

The method may further include applying a radio-frequency (RF) signal including the multi-echo pulse sequence to an object, receiving the MR signal emitted from the object in response to the applied RF signal and obtaining the MR image from the MR signal.

BRIEF DESCRIPTION OF THE DRAWINGS

These and/or other aspects will become apparent and more readily appreciated from the following description of the exemplary embodiments, taken in conjunction with the accompanying drawings in which:

FIG. 7A is a schematic diagram of a pulse sequence used by the MRI apparatus, according to an exemplary embodiment;

FIG. 7B is a schematic diagram of a pulse sequence used by the MRI apparatus, according to another exemplary embodiment;

FIG. 8 is a schematic diagram of a pulse sequence used by the MRI apparatus, according to another exemplary embodiment;

DETAILED DESCRIPTION

Figure 1A:
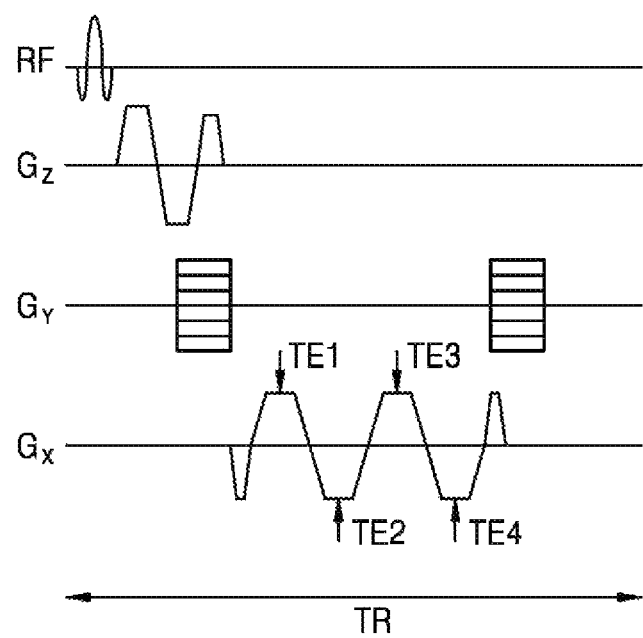
FIG. 1A is a diagram to describe obtaining a magnetic resonance (MR) signal by using a multi-echo pulse sequence, according to an exemplary embodiment.

The present specification describes principles of the present disclosure and sets forth exemplary embodiments thereof to clarify the scope of the present disclosure and to allow those of ordinary skill in the art to implement the exemplary embodiments. The present exemplary embodiments may have different forms.

Like reference numerals refer to like elements throughout the specification. The present specification does not describe all components in the exemplary embodiments, and common knowledge in the art or the same descriptions of the exemplary embodiments will be omitted below. The term "part" or "portion" may be implemented using hardware or software, and according to exemplary embodiments, one "part" or "portion" may be a single unit or element or include a plurality of units or elements. Hereinafter, the principles and exemplary embodiments of the present disclosure will be described in detail with reference to the accompanying drawings.

In the present specification, an "image" may include a medical image obtained by a magnetic resonance imaging (MRI) apparatus, a computed tomography (CT) apparatus, an ultrasound imaging apparatus, an X-ray apparatus, or another medical imaging apparatus.

Furthermore, in the present specification, an "object" may be a target to be imaged and include a human, an animal, or a part of a human or animal. For example, the object may include a body part (an organ) or a phantom.

An MRI system acquires an MR signal and reconstructs the acquired MR signal into an image. The MR signal denotes a radio frequency (RF) signal emitted from the object.

In the MRI system, a main magnet creates a static magnetic field to align a magnetic dipole moment of a specific atomic nucleus of the object placed in the static magnetic field along a direction of the static magnetic field. A gradient coil may generate a gradient magnetic field by applying a gradient signal to a static magnetic field and induce resonance frequencies differently according to each region of the object.

An RF coil may emit an RF signal to match a resonance frequency of a region of the object whose image is to be acquired. Furthermore, when gradient magnetic fields are applied, the RF coil may receive MR signals having different resonance frequencies emitted from a plurality of regions of the object. Though this process, the MRI system may obtain an image from an MR signal by using an image reconstruction technique.

FIG. 1A is a diagram for describing obtaining an MR signal by using a multi-echo pulse sequence, according to an exemplary embodiment.

FIG. 1A is a pulse sequence schematic diagram of a multi-echo pulse sequence using a gradient echo (GRE).

Referring to FIG. 1A, the multi-echo pulse sequence may include a plurality of echo times during one repetition time TR. Referring to FIG. 1A, the multi-echo pulse sequence includes four echo times TE1, TE2, TE3, and TE4 during one repetition time TR.

For example, when the multi-echo pulse sequence includes a number of echo times corresponding to a number of lines of an entire k-space to be obtained, the multi-echo pulse sequence may be referred to as an Echo-Planar Imaging (EPI) sequence. By using the EPI sequence, it is possible to obtain data of the entire k-space during one repetition time TR.

As another example, when the multi-echo pulse sequence includes two echo times, the multi-echo pulse sequence may be referred to as a dual-echo sequence. By using the dual-echo sequence, it is possible to obtain data of two lines of the k-space, the data being generated in two echo times during one repetition time TR.

The MRI apparatus may obtain, by using a multi-echo pulse sequence, a plurality of items of data of lines of the k-space which respectively correspond to a plurality of echo times during one repetition time TR.

For example, when the MRI apparatus obtains data of the k-space by using the multi-echo pulse sequence including the four echo times TE1, TE2, TE3, and TE4, the MRI apparatus may obtain a plurality of items of data of four lines during one repetition time TR.

The MRI apparatus may apply phase encoding gradients having different sizes to a plurality of repetition times, respectively, thereby obtaining a plurality of items of k-space data respectively corresponding to the four echo times TE1, TE2, TE3, and TE4 during the plurality of repetition times. In addition, the MRI apparatus may combine the plurality of items of k-space data respectively corresponding to the four echo times TE1, TE2, TE3, and TE4, thereby reconstructing one entire k-space.

When the entire k-space is reconstructed in an image, as described above, phases of MR signals due to different echo times, and a direction of a frequency encoding gradient repeatedly changes between negative and positive polarities, so artifacts may occur.

Referring to FIG. 1A, a gradient in a slice selecting direction is illustrated on a $G_Z$-axis, a gradient in a phase encoding direction is illustrated on a $G_Y$-axis, and a gradient in a frequency encoding direction is illustrated on a $G_X$-axis. Hereinafter, for convenience of illustration, the gradient in a slice selecting direction is illustrated on $G_Z$, the gradient in a frequency encoding direction is illustrated on $G_Y$, and the gradient in a frequency encoding direction is illustrated on $G_X$.

Figure 1B:
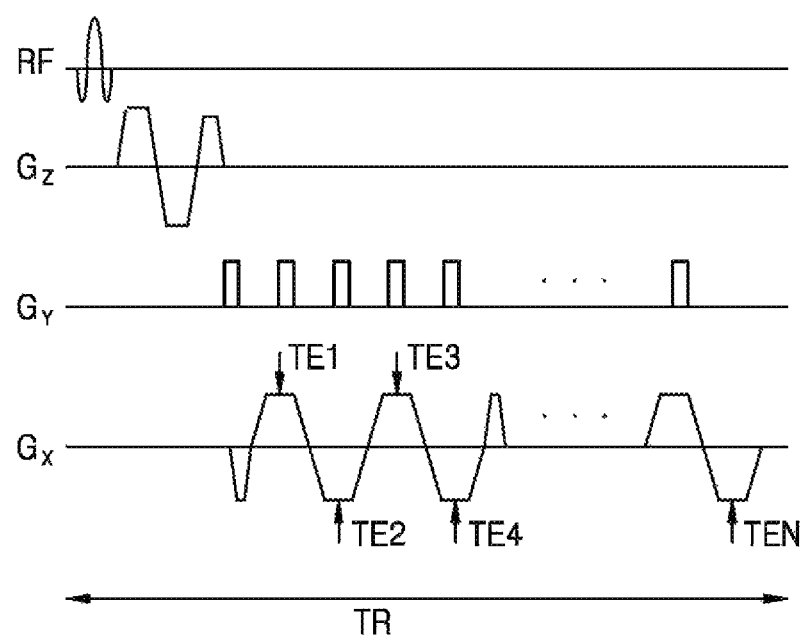
FIG. 1B is a diagram to describe obtaining an MR signal by using an Echo-Planar Imaging (EPI) sequence, according to an exemplary embodiment.

FIG. 1B is a diagram for describing obtaining an MR signal by using an EPI sequence, according to an exemplary embodiment.

FIG. 1B is a pulse sequence schematic diagram of a GRE EPI sequence. The MRI apparatus may apply one RF pulse, and then may obtain data of one k-space during a plurality of echo times TE1, TE2, TE3, TE4 . . . TEN.

As illustrated in FIG. 1B, because the direction of the frequency encoding gradient on Gx repeatedly changes between negative and positive polarities, artifacts may occur in a reconstructed image due to eddy current and an interference between a plurality of items of data obtained through different echoes. In addition, distortion may occur in a reconstructed image obtained by using an EPI technique.

Figure 1C:
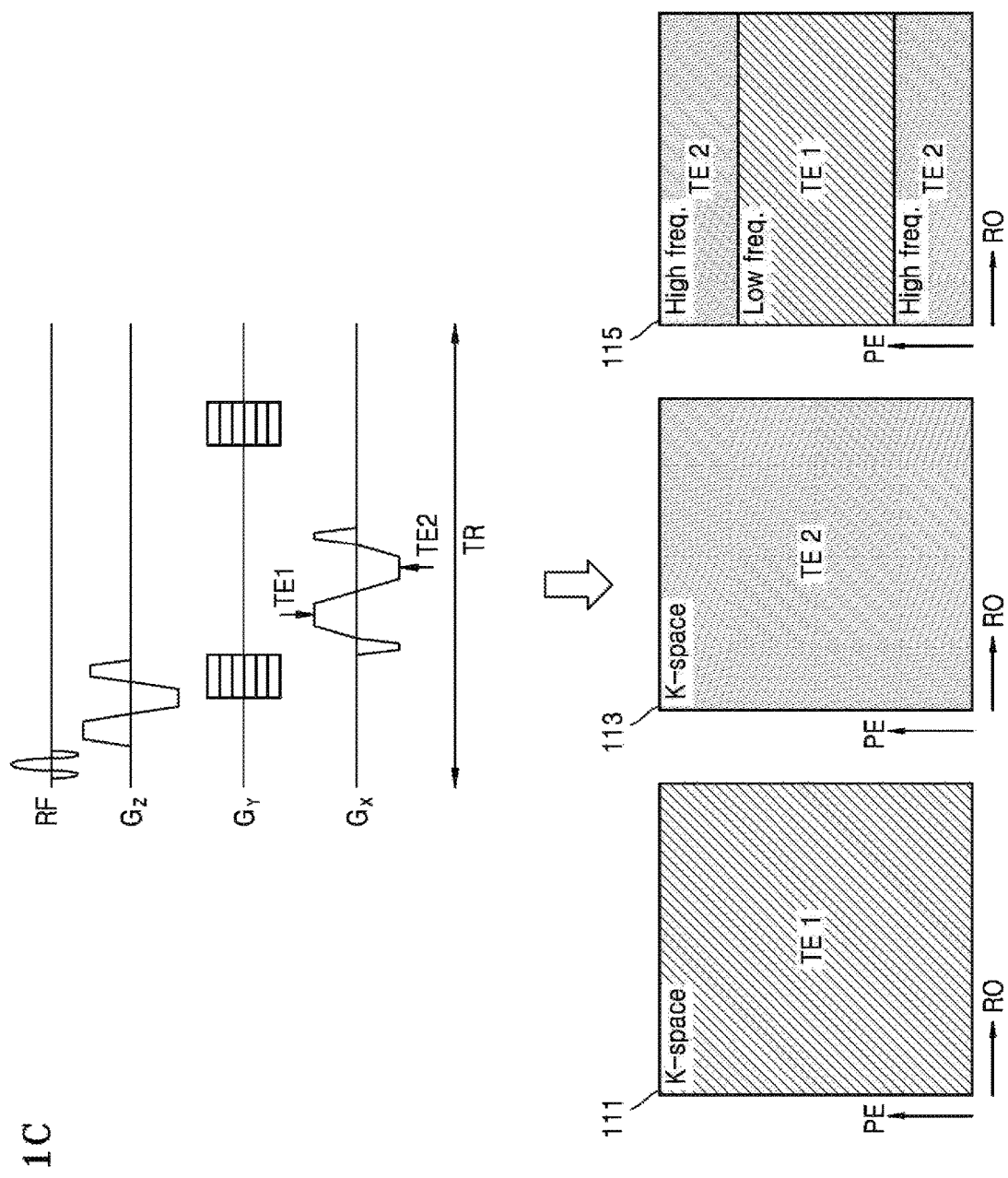
FIG. 1C is a diagram to describe obtaining a k-space by using a dual-echo sequence, according to an exemplary embodiment.

FIG. 1C is a diagram for describing obtaining a k-space by using a dual-echo sequence, according to an exemplary embodiment.

Referring to FIG. 1C, by using the dual-echo sequence, a first k-space 111 corresponding to a first echo time TE1 and a second k-space 113 corresponding to a second echo time TE2 may be obtained. A Kx-axis corresponds to a frequency encoding direction, and a Ky-axis corresponds to a phase encoding direction. Hereinafter, for convenience of illustration, an axis of the frequency encoding direction in a k-space is illustrated as the Kx-axis, and an axis of the phase encoding direction in the k-space is illustrated as the Ky-axis.

As illustrated in FIG. 1C, the first echo time TE1 may be an echo in an earlier time than the second echo time TE2 in a repetition time. Data of an entire k-space 115 may be obtained by using data of a low frequency domain Low freq. from among data of the first k-space 111 obtained by using the first echo time TE1 and data of a high frequency domain High freq. from among data of the second k-space 113 obtained by using the second echo time TE2.

When an MR image is reconstructed by using the data of the entire k-space 115, a ringing artifact occurs due to a difference between echo times of the data obtained from the low frequency domain Low freq. and the data obtained from the high frequency domain High freq. In particular, the ringing artifact may occur due to a difference between echo times in the vicinity of each boundary between the low frequency domain Low freq and the high frequency domain High freq.

Figure 2:
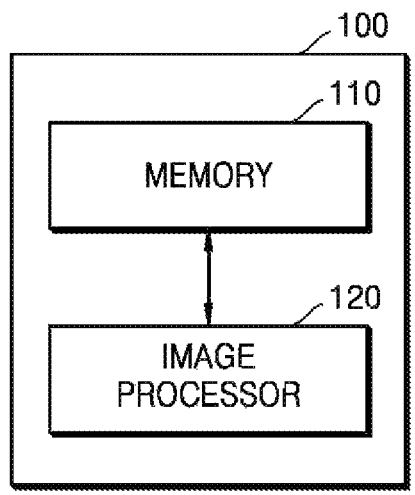
FIG. 2 is a block diagram of a magnetic resonance imaging (MRI) apparatus, according to an exemplary embodiment.

FIG. 2 is a block diagram of an MRI apparatus 100, according to an exemplary embodiment.

The MRI apparatus 100 according to the present exemplary embodiment obtains an MR image by using a multi-echo pulse sequence including a plurality of repetition times TR.

In addition, the MRI apparatus 100 of FIG. 2 may be an apparatus configured to obtain an MR image by MRI scanning an object. The MRI apparatus 100 may be the apparatus further configured to obtain an MR image by processing MR data obtained by MRI scanning the object.

For example, the MRI apparatus 100 may be an apparatus configured to apply RF pulses to the object via a plurality of channel coils in a high frequency multi-coil and to reconstruct MR images by using MR signals obtained via the plurality of channel coils.

In addition, the MRI apparatus 100 may be a server apparatus configured to provide a pulse sequence to be applied to an object and to reconstruct an MR image by using an MR signal obtained with the pulse sequence. In this case, the server apparatus may be a medical server apparatus in a hospital where an MRI scan is performed on a patient or another hospital.

Referring to FIG. 2, the MRI apparatus 100 may include a memory 110 and an image processor 120.

The memory 110 may store a multi-echo pulse sequence to be applied to an object. In addition, the memory 110 may store MR signals obtained based on the multi-echo pulse sequence.

The image processor 120 may obtain an MR signal from an object based on a pulse sequence. For example, the image processor 120 may obtain the MR signal based on a pulse sequence stored in the memory 110 of the MRI apparatus 100 or a pulse sequence received from an external device.

The image processor 120 according to the present exemplary embodiment may obtain the MR signal from the object based on a multi-echo pulse sequence including a plurality of repetition times.

For example, the MR signal may be received from a scanner. Alternatively, the MR signal may be received from the memory 110 of the MRI apparatus 100 or an external device.

The multi-echo pulse sequence including the plurality of repetition times may include a gradient echo sequence, a spin echo sequence, a fast spin echo sequence, a gradient- and spin-echo (GRASE) sequence, or the like.

The image processor 120 may obtain an image of the object based on the MR signal obtained from the object. The image processor 120 may include a module to reconstruct an MR image.

In more detail, the image processor 120 may obtain k-space data based on the MR signal. In addition, the image processor 120 may reconstruct the MR image based on the k-space data.

The image processor 120 may determine at least one of a first echo time and a second echo time to have different values in two adjacent repetition times from among the plurality of repetition times.

The image processor 120 may also provide a multi-echo pulse sequence including the determined first echo time and the determined second echo time, during the plurality of repetition times.

In exemplary embodiments, the image processor 120 may store the multi-echo pulse sequence including the determined first echo time and the determined second echo time in the memory 110 of the MRI apparatus 100 or a memory of the external device. In addition, the image processor 120 may provide a signal for controlling the scanner to perform an MRI scan based on the stored multi-echo pulse sequence.

In addition, the image processor 120 may determine a difference value dTE between the first echo time and the second echo time to be different in two adjacent repetition times from among the plurality of repetition times.

The image processor 120 may determine the first echo time and the second echo time by using a differential formula. In this regard, the differential formula may correspond to a function of a value of a phase encoding axis in a k-space.

The image processor 120 may determine a flat period that is a time period in which one of the first echo time and the second echo time is not changed in two adjacent repetition times from among the plurality of repetition times.

The image processor 120 may determine a transition period that is a time period in which both the first echo time and the second echo time are changed in two adjacent repetition times from among the plurality of repetition times.

The image processor 120 may determine the first echo time and the second echo time to be sequentially increased or decreased according to a sequential increase in the value of the phase encoding axis. In this regard, the plurality of repetition times may correspond to the value of the phase encoding axis in the k-space.

Alternatively, the image processor 120 may determine the first echo time and the second echo time to have irregular periods with respect to a sequential increase or decrease in the first echo time and the second echo time.

First k-space data corresponding to the first echo time may correspond to a low frequency domain in the k-space, and second k-space data corresponding to the second echo time may correspond to a high frequency domain in the k-space.

The image processor 120 may change a length of the first echo time and a length of the second echo time by controlling an intensity of a readout gradient applied to a first time period corresponding to the first echo time and an intensity of a readout gradient applied to a second time period corresponding to the second echo time.

The MRI apparatus 100 may further include a display. The display may provide data received from the memory 110 and the image processor 120.

The display may display a pulse sequence received from the memory 110. The pulse sequence may include a multi-echo pulse sequence.

In addition, the display may display image data obtained from the image processor 120.

Figure 3:
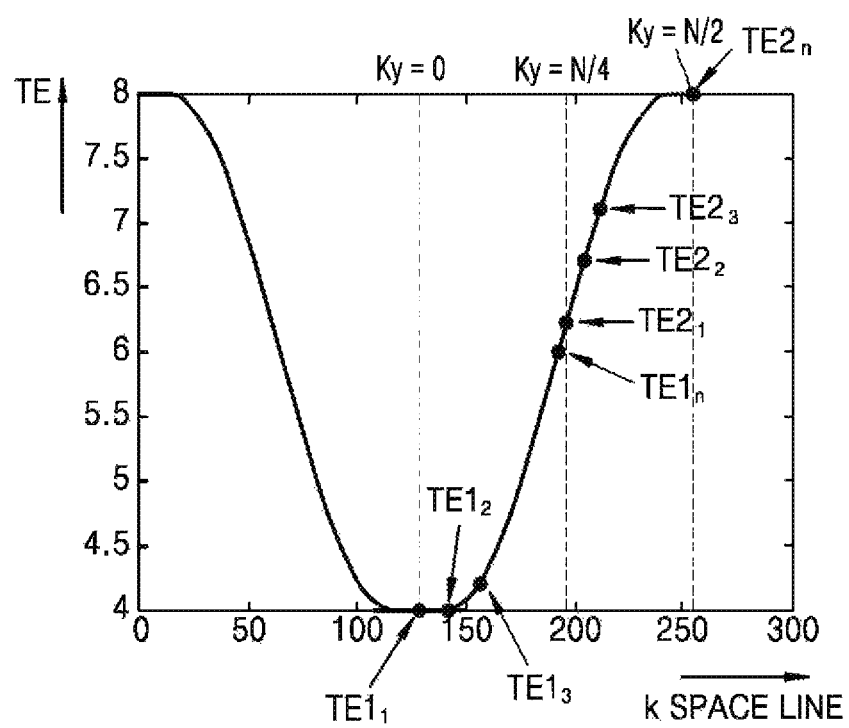
FIG. 3 is a diagram for describing a method of determining, by the MRI apparatus, a first echo time and a second echo time of the multi-echo pulse sequence, according to an exemplary embodiment.

FIG. 3 is a diagram for describing a method of determining, by the MRI apparatus 100, the first echo time TE1 and the second echo time TE2 of the multi-echo pulse sequence, according to an exemplary embodiment.

The MRI apparatus 100 may determine the first echo time TE1 and the second echo time TE2 for a dual-echo sequence. In addition, the MRI apparatus 100 may determine the first echo time TE1 and the second echo time TE2 for a multi-echo pulse sequence including at least three echo times.

Referring to the graph of FIG. 3, numbers of k-space lines obtained at respective echo times in a k-space are illustrated on a horizontal axis. The numbers of the k-space lines may sequentially correspond to a bottom line of the k-space through a top line of the k-space.

On a vertical axis of the graph of FIG. 3, the echo times corresponding to the k-space lines are illustrated. An echo time of a k-space line may indicate an echo time when the k-space line is obtained.

Referring to FIG. 3, $TE1_1$ may indicate a first echo time in a first repetition time, $TE1_2$ may indicate a first echo time in a second repetition time, and $TE1_3$ may indicate a first echo time in a third repetition time. In addition, $TE1_n$ may indicate a first echo time in an $n_{th}$ repetition time. Equally, $TE2_1$ may indicate a second echo time in a first repetition time, $TE2_2$ may indicate a second echo time in a second repetition time, and $TE3_3$ may indicate a second echo time in a third repetition time. In addition, $TE2_n$ may indicate a second echo time in an $n_{th}$ repetition time.

Referring to FIG. 3, the first echo times $TE1_1$, $TE1_2$, $TE1_3$ ... $TE1_n$ may correspond to a domain between Ky=0 and Ky=N/4 of a k-space (where, N is the number of all obtained lines of the k-space). For example, the first echo times $TE1_1$, $TE1_2$, $TE1_3$ ... $TE1_n$ may correspond to a low frequency domain.

In addition, the second echo times $TE2_1$, $TE2_2$, $TE2_3$ ... $TE2_n$ may correspond to a domain between Ky=N/4 and Ky=N/2 of the k-space (where, N is the number of all lines of the k-space). For example, the second echo times $TE2_1$, $TE2_2$, $TE2_3$ ... $TE2_n$ may correspond to a high frequency domain.

Referring to FIG. 3, k-space data corresponding to a domain between Ky=0 and Ky=N/2 of the k-space during $n_{th}$ repetition times of a multi-echo pulse sequence including the first echo times and the second echo times may be obtained.

The first echo times $TE1_1$, $TE1_2$, $TE1_3$ ... $TE1_n$ and the second echo times $TE2_1$, $TE2_2$, $TE2_3$ ... $TE2_n$ shown in FIG. 3 may be variable with respect to each repetition time. For example, the first echo times $TE1_1$, $TE1_2$, $TE1_3$ ... $TE1_n$ and the second echo times $TE2_1$, $TE2_2$, $TE2_3$ ... $TE2_n$ may be sequentially increased or decreased according to an increase in the number of repetition times. In this regard, the number of repetition times may correspond to k-space line numbers shown in FIG. 3 or may correspond to values of a phase encoding axis of the k-space.

The MRI apparatus 100 according to the present exemplary embodiment may determine at least one of the first echo times and the second echo times to have different values in two adjacent repetition times from among the plurality of repetition times.

For example, the MRI apparatus 100 may determine $TE1_1$ and $TE1_2$, which are the first echo times of the first repetition time and the second repetition time, to be different from each other. In addition, the MRI apparatus 100 may determine $TE2_1$ and $TE2_2$, which are the second echo times of the first repetition time and the second repetition time, to be different from each other. In addition, the MRI apparatus 100 may determine $TE1_1$ and $TE1_2$ to be different from each other and $TE2_1$ and $TE2_2$ to be different from each other.

While echo times in the first repetition time and the second repetition time are described above, the descriptions may be equally applied to other two adjacent repetition times.

As illustrated in FIG. 3, the MRI apparatus 100 may determine the first echo time TE1 and the second echo time TE2 by using a differential formula.

The differential formula may include a sinusoidal function, the Gaussian function, a quadratic function, a cubic function, or the like.

As illustrated in FIG. 3, when the MRI apparatus 100 determines at least one of the first echo time TE1 and the second echo time TE2 to have different values in adjacent repetition times, a sharp change in echo times in the k-space does not occur.

For example, the MRI apparatus 100 may allow an echo time at Ky=N/2, which is a boundary between a k-space domain corresponding to a first echo time and a k-space domain corresponding to a second echo time, not to be sharply changed.

For example, in an exemplary embodiment as shown in FIG. 3, a difference between a value of the second echo time $TE2_1$ of the first repetition time and a value of the first echo time $TE1_n$ of the $n_{th}$ repetition time is not sharp compared to a difference between echo times in adjacent repetition times in another domain.

With respect to a plurality of repetition times, a comparison between a case in which a first echo time and a second echo time are not changed, and a case in which the first echo time and the second echo time are changed will, be described below with reference to FIG. 4.

Figure 4:
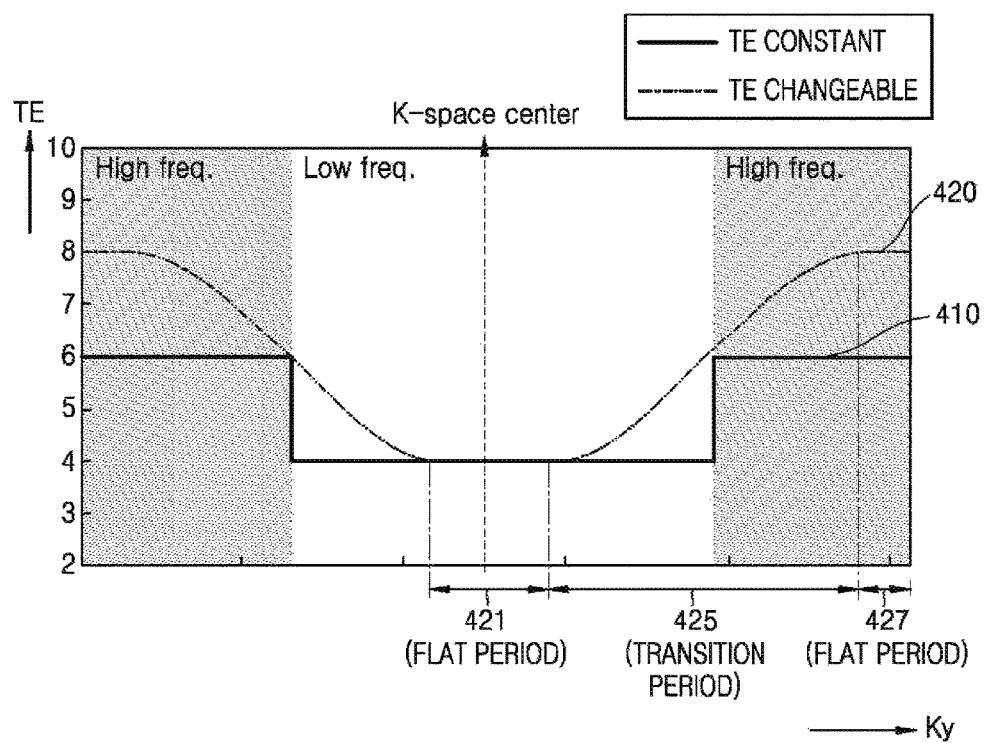
FIG. 4 is a diagram for describing a method of determining, by the MRI apparatus, the first echo time and the second echo time of the multi-echo pulse sequence, according to an exemplary embodiment.

FIG. 4 is a diagram for describing a method of determining, by the MRI apparatus 100, the first echo time TE1 and the second echo time TE2 of the multi-echo pulse sequence, according to an exemplary embodiment.

In the graph of FIG. 4, a horizontal axis corresponds to a Ky-axis of a k-space, and a vertical axis corresponds to echo times.

FIG. 4 illustrates a graph 410 of a case including a first echo time $TE1_0$ and a second echo time $TE2_0$ that are constant in a plurality of repetition times. FIG. 4 also illustrates a differentiable curve 420 to determine the first echo time TE1 and the second echo time TE2 of the multi-echo pulse sequence. A formula of the differentiable curve 420 illustrated in FIG. 4 may be a function of a value of a phase encoding axis (Ky) of the k-space.

The MRI apparatus 100 may determine flat periods 421 and 427 that are time periods in which one of the first echo time TE1 and the second echo time TE2 is not changed in two adjacent repetition times.

For example, the flat period 421 may be a period in which the first echo time TE1 is not changed. For example, the first echo time TE1 of the flat period 421 may be determined to be equal to a value of the first echo time $TE1_0$ of a low frequency domain Low freq. in the graph 410. For example, referring to FIG. 4, the value of the first echo time $TE1_0$ of the low frequency domain Low freq. in the graph 410 may be 4 ms. Because an echo time in a domain of the low frequency domain Low freq. of the k-space, the echo time corresponding to the flat period 421, is set as a small value, an MR signal having a high magnitude may be obtained.

In addition, the flat period 427 may be a period in which the second echo time TE2 is not changed. In this regard, the second echo time TE2 may be determined to be equal to a largest echo time value in a high frequency domain High freq. In an exemplary embodiment as shown in FIG. 4., the largest echo time value in the high frequency domain High freq. may be 8 ms.

The MRI apparatus 100 may determine a transition period 425 in which both the first echo time TE1 and the second echo time TE2 are changed in two adjacent repetition times. The transition period 425 may be determined based on a differentiable curve as the graph 410 of FIG. 4.

Figure 5:
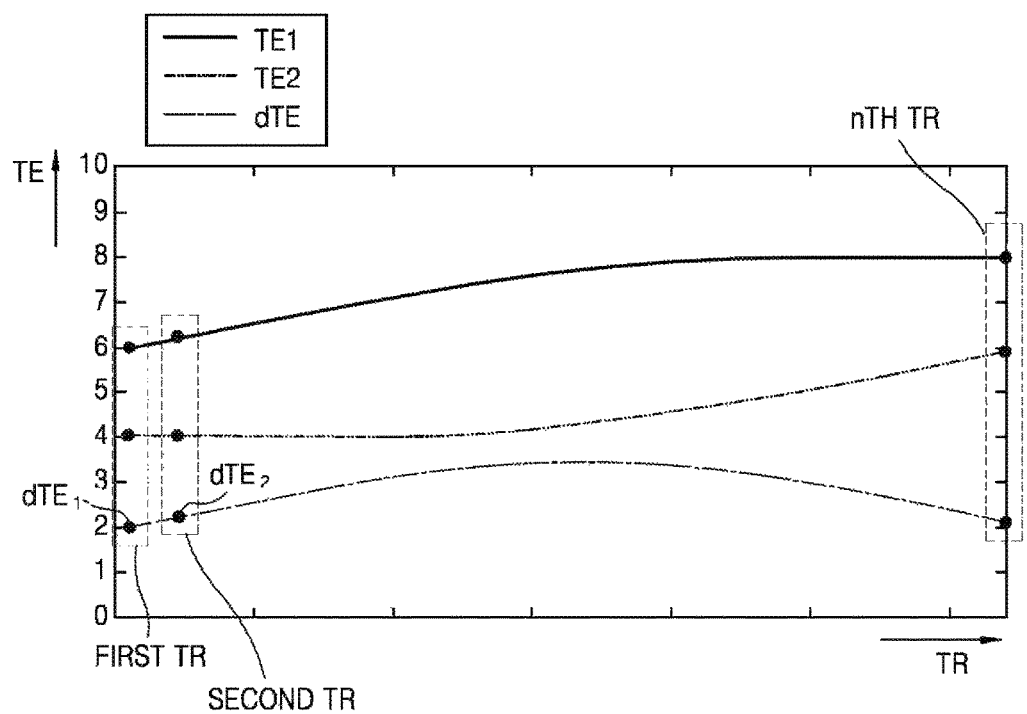
FIG. 5 is a diagram for describing the first echo time, the second echo time, and difference values of the first echo time and the second echo time determined by the MRI apparatus, according to an exemplary embodiment.

FIG. 5 is a diagram for describing the first echo time TE1, the second echo time TE2, and difference values dTE of the first echo time TE1 and the second echo time TE2 determined by the MRI apparatus 100, according to an exemplary embodiment.

Referring to FIG. 5, graphs of the first echo time TE1 and the second echo time TE2 determined with respect to a plurality of repetition times TR, and difference values dTE of the first echo time TE1 and the second echo time TE2 are illustrated.

As illustrated in FIG. 5, the MRI apparatus 100 may determine a difference value dTE between the first echo time TE1 and the second echo time TE2 to be different in two adjacent repetition times from among the plurality of repetition times TR.

For example, referring to FIG. 5, a difference value dTE1 between the first echo time TE1 and the second echo time TE2 included in a first repetition time may be different from a difference value dTE2 between the first echo time TE1 and the second echo time TE2 included in a second repetition time.

Referring to FIG. 5, the difference value dTE between the first echo time TE1 and the second echo time TE2 may be determined by using a differential formula.

Figure 6:
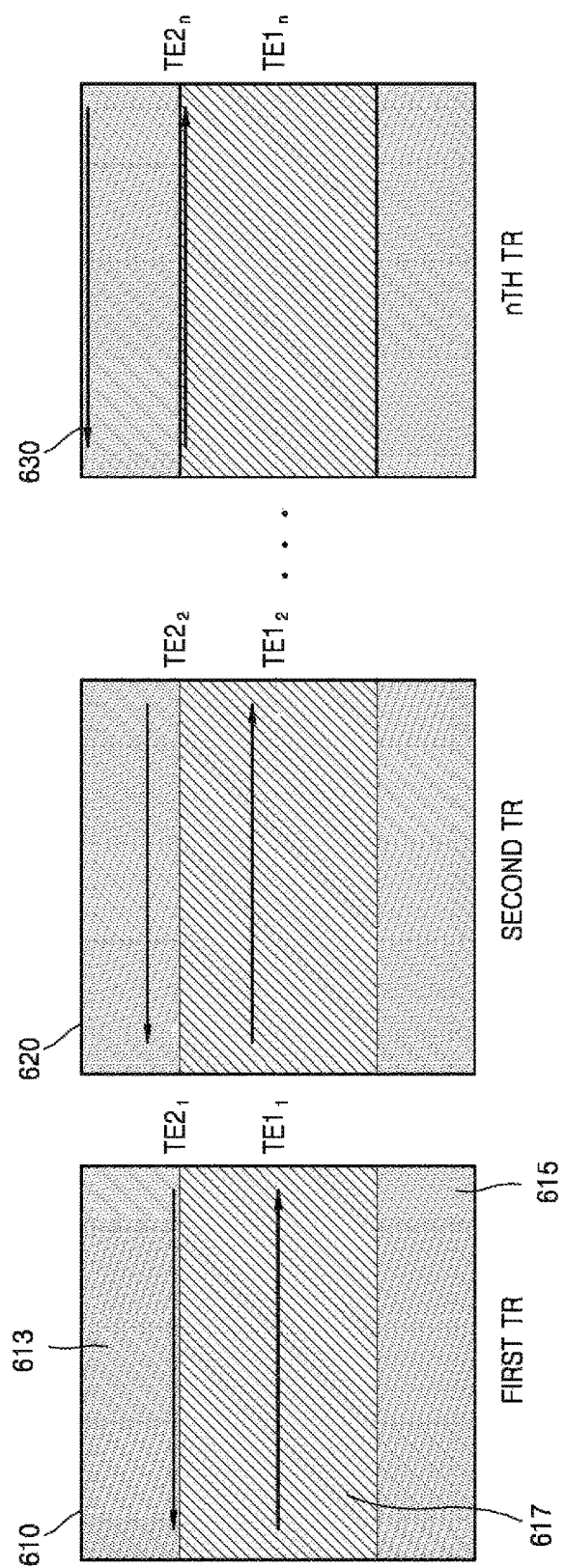
FIG. 6 illustrates obtaining k-space data by using a multi-echo pulse sequence, the obtaining being performed by the MRI apparatus, according to an exemplary embodiment.

FIG. 6 illustrates obtaining k-space data by using a multi-echo pulse sequence, the obtaining being performed by the MRI apparatus 100, according to an exemplary embodiment.

As described above, the MRI apparatus 100 may obtain data of an entire k-space by using data corresponding to a low frequency domain 617 of the k-space which is obtained by using the first echo time TE1, and two items of data corresponding to high frequency domains 613 and 615 of the k-space which are obtained by using the second echo time TE2.

The MRI apparatus 100 may obtain the data of the entire k-space, based on the first echo time TE1 and the second echo time TE2 determined according to the exemplary embodiment.

Referring to FIG. 6, k-space data 610 corresponding to a first repetition time may include k-space line data corresponding to a first echo time $TE1_1$ and k-space line data corresponding to a second echo time $TE2_1$. K-space data 620 corresponding to a second repetition time may include k-space line data corresponding to a first echo time $TE1_2$ and k-space line data corresponding to a second echo time $TE2_2$. Equally, k-space data 630 corresponding to an $n_{th}$ repetition time may include k-space line data corresponding to a first echo time $TE1_n$ and k-space line data corresponding to a second echo time $TE2_n$.

At least one of the first echo times $TE1_1$, $TE1_2$, ... $TE1_n$ and the second echo times $TE2_1$, $TE2_2$, ... $TE2_n$ may be determined to be different in adjacent echo times.

The first echo times $TE1_1$, $TE1_2$, ... $TE1_n$ and the second echo times $TE2_1$, $TE2_2$, ... $TE2_n$ may be determined by using a differential formula. In addition, a difference value dTE between a first echo time and a second echo time may be determined by using a differential formula.

FIG. 7A is a schematic diagram of a pulse sequence used by the MRI apparatus 100, according to an exemplary embodiment.

FIG. 7A is a pulse sequence schematic diagram of a repetition time of a multi-echo pulse sequence including a plurality of repetition times according to an exemplary embodiment.

Referring to FIG. 7A, the multi-echo pulse sequence may include two echoes generated in a first echo time TE1 and a second echo time TE2 after a time point 771 at which a RF pulse 711 is applied thereto.

After the RF pulse 711, the MRI apparatus 100 may provide frequency encoding gradients 731 and 733. The frequency encoding gradient 731 may correspond to the first echo time TE1, and the frequency encoding gradient 733 may correspond to the second echo time TE2.

A period 751 in which k-space data corresponding to the first echo time TE1 is obtained may correspond to a first time period, and a period 753 in which k-space data corresponding to the second echo time TE2 is obtained may correspond to a second time period.

The MRI apparatus 100 may change lengths of the periods 751 and 753 by changing intensities of the frequency encoding gradients 731 and 733. For example, when the intensity of the frequency encoding gradient 731 is increased, the length of the period 751 may be decreased, so that the first echo time TE1, the second echo time TE2, and a difference value dTE between the first echo time TE1 and the second echo time TE2 may be adjusted.

FIG. 7B is a schematic diagram of a pulse sequence used by the MRI apparatus 100, according to another exemplary embodiment.

FIG. 7B is a pulse sequence schematic diagram of a repetition time of a multi-echo pulse sequence including a plurality of repetition times.

Referring to FIG. 7B, the multi-echo pulse sequence may include two echoes generated in a first echo time TE1 and a second echo time TE2 after a time point 781 at which a RF pulse 721 is applied thereto.

After the RF pulse 721, the MRI apparatus 100 may provide frequency encoding gradients 741 and 743. The frequency encoding gradient 741 may correspond to the first echo time TE1, and the frequency encoding gradient 743 may correspond to the second echo time TE2. A period 761 in which k-space data corresponding to the first echo time TE1 is obtained may correspond to a first time period, and a period 763 in which k-space data corresponding to the second echo time TE2 is obtained may correspond to a second time period.

The frequency encoding gradients 741 and 743 may be provided earlier than the frequency encoding gradients 731 and 733 illustrated in FIG. 7A. Accordingly, the first echo time TE1 and the second echo time TE2 illustrated in FIG.

7B may be earlier than the first echo time TE1 and the second echo time TE2 illustrated in FIG. 7A.

As described with reference to FIGS. 7A and 7B, the MRI apparatus 100 may change intensities and application times with respect to the frequency encoding gradients 741 and 743 or readout gradients, thereby changing the first echo time TE1, the second echo time TE2, and the difference value dTE between the first echo time TE1 and the second echo time TE2.

FIG. 8 is a schematic diagram of a pulse sequence used by the MRI apparatus 100, according to another exemplary embodiment.

FIG. 8 illustrates a part of a pulse sequence schematic diagram of a multi-echo pulse sequence including a plurality of repetition times. The pulse sequence schematic diagram of FIG. 8 may correspond to a pulse sequence using a spin echo.

Referring to FIG. 8, a value of a first echo time TE1 may correspond to 2*t1, and a value of a second echo time TE2 may correspond to 2*t1+2*t2.

The MRI apparatus 100 may change the first echo time TE1, the second echo time TE2, and a difference value dTE between the first echo time TE1 and the second echo time TE2 by adjusting t1 during which a RF pulse is applied, and 2*t1+2*t2, and adjusting a size of a frequency encoding gradient Gx.

Figure 9:
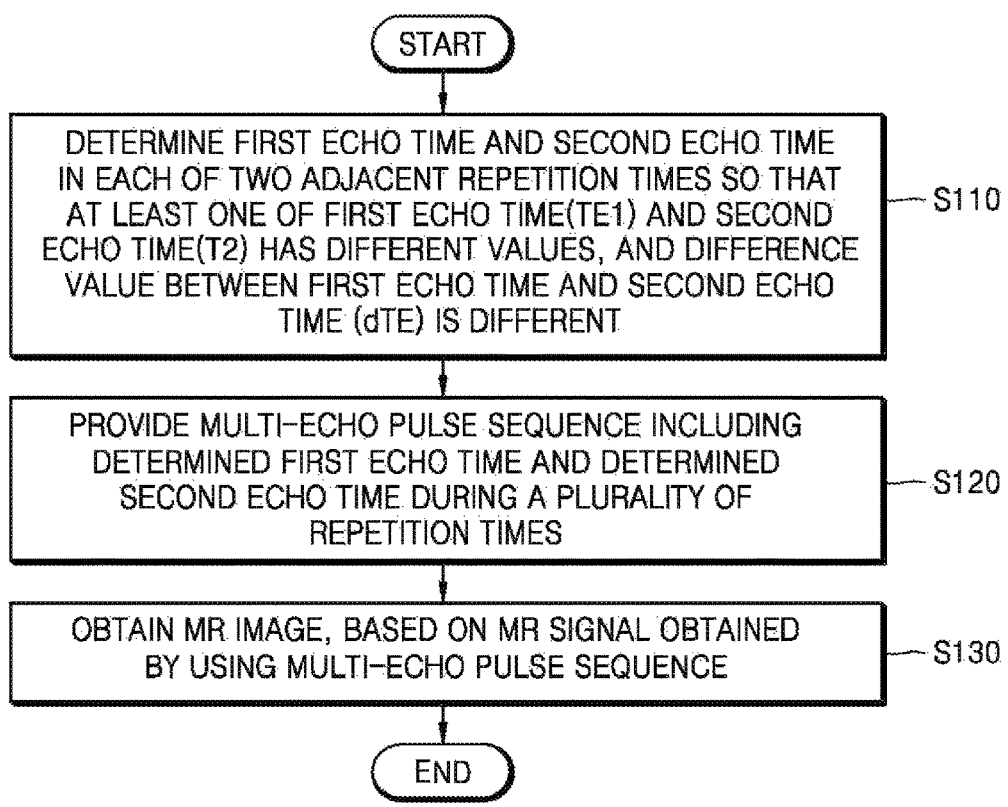
FIG. 9 is a flowchart of a method of obtaining an MR image, according to an exemplary embodiment.

FIG. 9 is a flowchart of a method of obtaining an MR image, according to an exemplary embodiment.

The method of obtaining an MR image according to the present exemplary embodiment may be performed to obtain the MR image by using a multi-echo pulse sequence including a plurality of repetition times.

In operation S110, the MRI apparatus 100 may determine a first echo time TE1 and a second echo time TE2 so that at least one of the first echo time TE1 and the second echo time TE2 has different values in two adjacent repetition times, and a difference value dTE between the first echo time TE1 and the second echo time TE2 is different in two adjacent repetition times from among the plurality of repetition times (S110).

Stated differently, plurality of repetition times may include a first repetition time adjacent to a second repetition time, and a plurality of echo times included in the plurality of repetition times may include a first echo time of the first repetition time, a second echo time of the first repetition time, a first echo time of the second repetition time, and a second echo time of the second repetition time. A value of the first echo time of the first repetition time may be different from a value of the first echo time of the second repetition time, and a value of the second echo time of the first repetition time may be different from a value of the second echo time of the second repetition time. In addition, a first difference value between the first echo time of the first repetition time and the second echo time of the first repetition time, may be different from a second difference value between the first echo time of the second repetition time and the second echo time of the second repetition time.

The MRI apparatus 100 according to the present exemplary embodiment may determine the first echo time TE1 and the second echo time TE2 by using a differential formula.

In operation S120, the MRI apparatus 100 may provide a multi-echo pulse sequence including the determined first echo time TE1 and the determined second echo time TE2 during the plurality of repetition times (S120).

In operation S130, the MRI apparatus 100 may obtain an MR image, based on an MR signal obtained by using the multi-echo pulse sequence (S130).

Figure 10:
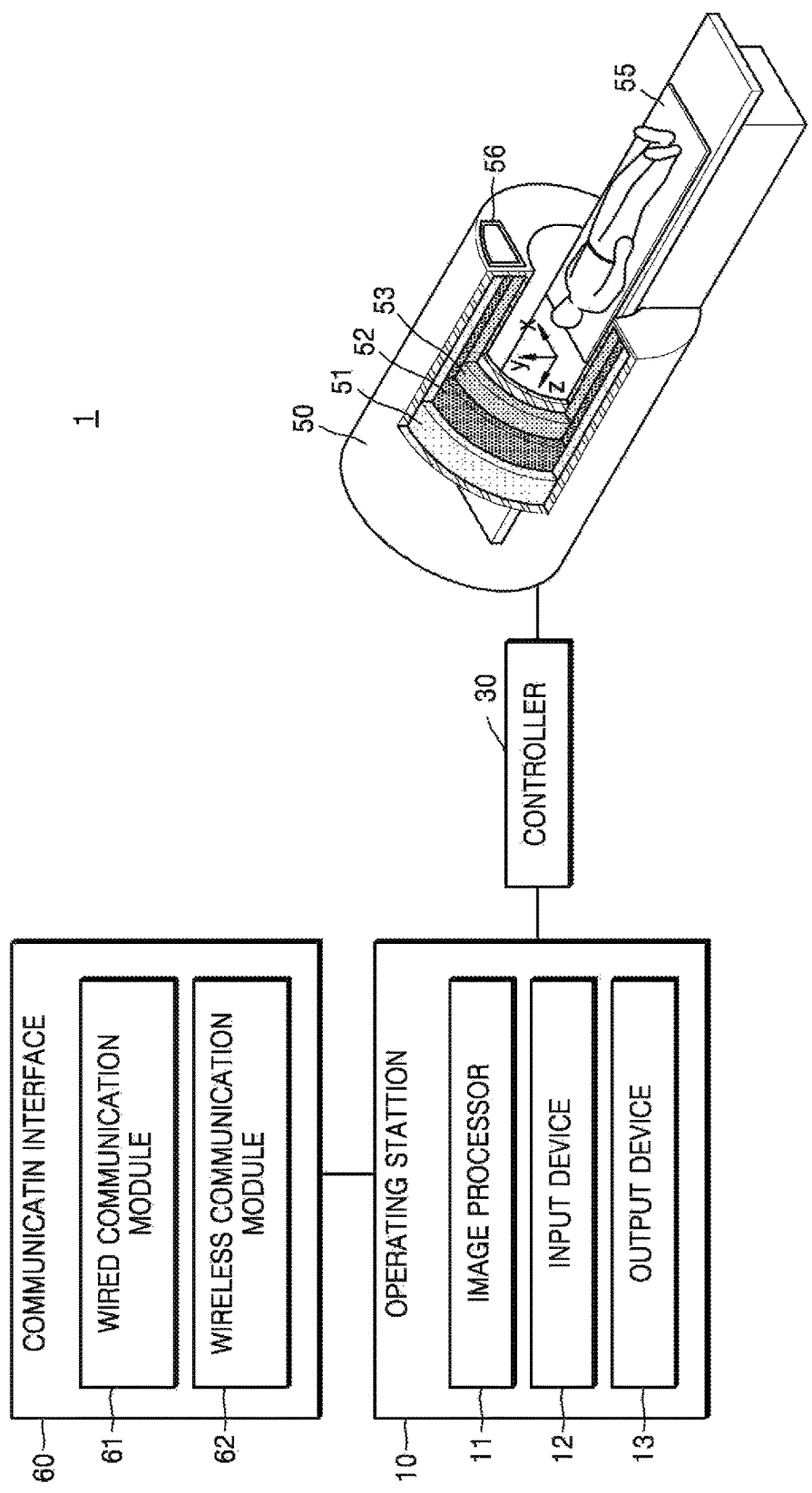
FIG. 10 is a schematic diagram of an MRI system.

FIG. 10 is a schematic diagram of an MRI system 1. Referring to FIG. 10, the MRI system 1 may include an operating station 10, a controller 30, and a scanner 50. The controller 30 may be independently separated from the operating station 10 and the scanner 50 as illustrated in FIG. 10. Furthermore, the controller 30 may be separated into a plurality of sub-components and incorporated into the operating station 10 and the scanner 50 in the MRI system 1. Operations of the components in the MRI system 1 will now be described in detail.

The scanner 50 may be formed to have a cylindrical shape (e.g., having a shape of a bore) having an empty inner space into which an object may be inserted. A static magnetic field and a gradient magnetic field are created in the inner space of the scanner 50, and an RF signal is emitted toward the inner space.

The scanner 50 may include a static magnetic field generator 51, a gradient magnetic field generator 52, an RF coil 53, a table 55, and a display 56. The static magnetic field generator 51 creates a static magnetic field for aligning magnetic dipole moments of atomic nuclei of the object in a direction of the static magnetic field. The static magnetic field generator 51 may include a permanent magnet or superconducting magnet using a cooling coil.

The gradient magnetic field generator 52 is connected to the controller 30. The gradient magnetic field generator 52 generates a gradient magnetic field by applying a gradient to a static magnetic field in response to a control signal received from the controller 30. The gradient magnetic field generator 52 includes X, Y, and Z coils for generating gradient magnetic fields in X-, Y-, and Z-axis directions crossing each other at right angles and generates a gradient signal according to a position of a region being imaged so as to differently induce resonance frequencies according to regions of the object.

The RF coil 53 connected to the controller 30 may emit an RF signal toward the object in response to a control signal received from the controller 30 and receive an MR signal emitted from the object. In detail, the RF coil 53 may transmit, toward atomic nuclei of the object having precessional motion, an RF signal having the same frequency as that of the precessional motion, stop transmitting the RF signal, and then receive an MR signal emitted from the object.

The RF coil 53 may include a transmitting RF coil for generating an electromagnetic wave having an RF corresponding to the type of an atomic nucleus, a receiving RF coil for receiving an electromagnetic wave emitted from an atomic nucleus, or one transmitting/receiving RF coil serving both functions of the transmitting RF coil and receiving RF coil. Furthermore, in addition to the RF coil 53, a separate coil may be attached to the object. Examples of the separate coil may include a head coil, a spine coil, a torso coil, and a knee coil according to a region being imaged or to which the separate coil is attached.

The display 56 may be disposed outside and/or inside the scanner 50. The display 56 is also controlled by the controller 30 to provide a user or the object with information related to medical imaging.

Furthermore, the scanner 50 may include an object monitoring information acquisition unit configured to acquire and transmit monitoring information about a state of the object. For example, the object monitoring information acquisition unit may acquire monitoring information related to the object from a camera for capturing images of a movement or position of the object, a respiration measurer for measuring the respiration of the object, an ECG measurer for measuring the electrical activity of the heart of the object, or a temperature measurer for measuring a temperature of the object and transmit the acquired monitoring information to the controller 30. The controller 30 may in turn control an operation of the scanner 50 based on the monitoring information about the object. Operations of the controller 30 will now be described in more detail.

The controller 30 may control overall operations of the scanner 50.

The controller 30 may control a sequence of signals formed in the scanner 50. The controller 30 may control the gradient magnetic field generator 52 and the RF coil 53 according to a pulse sequence received from the operating station 10 or a designed pulse sequence.

A pulse sequence may include all pieces of information required to control the gradient magnetic field generator 52 and the RF coil 53. For example, the pulse sequence may include information about a strength, a duration, and application timing of a pulse signal applied to the gradient magnetic field generator 52.

The controller 30 may control a waveform generator for generating a gradient wave, i.e., an electrical pulse according to a pulse sequence and a gradient amplifier for amplifying the generated electrical pulse and transmitting the same to the gradient magnetic field generator 52. Thus, the controller 30 may control formation of a gradient magnetic field by the gradient magnetic field generator 52.

Furthermore, the controller 30 may control an operation of the RF coil 53. For example, the controller 30 may supply an RF pulse having a resonance frequency to the RF coil 53 that emits an RF signal toward the object, and receive an MR signal received by the RF coil 53. In this case, the controller 30 may adjust emission of an RF signal and reception of an MR signal according to an operating mode by controlling an operation of a switch (e.g., a T/R switch) for adjusting transmitting and receiving directions of the RF signal and the MR signal based on a control signal.

The controller 30 may control a movement of the table 55 where the object is placed. Before MRI is performed, the controller 30 may move the table 55 according to which region of the object is to be imaged.

The controller 30 may also control the display 56. For example, the controller 30 may control the on/off state of the display 56 or a screen to be output on the display 56 according to a control signal.

The controller 30 may include an algorithm for controlling operations of the components in the MRI system 1, a memory for storing data in the form of a program, and a processor for performing the above-described operations by using the data stored in the memory. In exemplary embodiments, the memory and the processor may be implemented as separate chips. In other exemplary embodiments, the memory and processor may be incorporated into a single chip.

The operating station 10 may control overall operations of the MRI system 1. The operating station 10 may include an image processor 11, an input device 12, and an output device 13.

In addition, the operating station 10 may further include the memory 110 illustrated in FIG. 2.

The image processor 11 may control the memory to store an MR signal received from the controller 30, and generate image data with respect to the object from the stored MR signal by applying an image reconstruction technique by using an image processor.

For example, if a k space (for example, also referred to as a Fourier space or a frequency space) of the memory is filled with digital data to complete k-space data, the image processor 11 may reconstruct image data from the k-space data by applying various image reconstruction techniques (e.g., by performing inverse Fourier transform on the k-space data) by using the image processor.

Furthermore, the image processor 11 may perform various signal processing operations on MR signals in parallel. For example, the image processor 11 may perform signal processing on a plurality of MR signals received via a multi-channel RF coil in parallel so as to convert the plurality MR signals into image data. In addition, the image processor 11 may store not only the image data in the memory, or the controller 30 may store the same in an external server via a communication interface 60 as will be described below.

In addition, the image processor 11 may include the image processor 120 illustrated in FIG. 2.

The input device 12 may receive, from the user, a control command for controlling the overall operations of the MRI system 1. For example, the input device 12 may receive, from the user, object information, parameter information, a scan condition, and information about a pulse sequence. The input device 12 may be a keyboard, a mouse, a track ball, a voice recognizer, a gesture recognizer, a touch screen, or any other input device.

The output device 13 may output image data generated by the image processor 11. The output device 13 may also output a user interface (UI) configured so that the user may input a control command related to the MRI system 1. The output device 13 may include a speaker, a printer, a display, or any other output device.

Furthermore, although FIG. 10 shows that the operating station 10 and the controller 30 are separate components, the operating station 10 and the controller 30 may be included in a single device as described above. Furthermore, processes respectively performed by the operating station 10 and the controller 30 may be performed by another component. For example, the image processor 11 may convert an MR signal received from the controller 30 into a digital signal, or the controller 30 may directly perform the conversion of the MR signal into the digital signal.

The MRI system 1 may further include a communication interface 60 and be connected to an external device such as a server, a medical apparatus, and a portable device (e.g., a smartphone, a tablet PC, a wearable device, etc.) via the communication interface 60.

The communication interface 60 may include at least one component that enables communication with an external device. For example, the communication interface 60 may include at least one of a local area communication module, a wired communication module 61, and a wireless communication module 62.

The communication interface 60 may receive a control signal and data from an external device and transmit the received control signal to the controller 30 so that the controller 30 may control the MRI system 1 according to the received signal.

Alternatively, by transmitting a control signal to an external device via the communication interface 60, the controller 30 may control the external device according to the control signal.

For example, the external device may process data of the external device according to a control signal received from the controller 30 via the communication interface 60.

A program for controlling the MRI system 1 may be installed on the external device and may include instructions for performing some or all of the operations of the controller 30.

The program may be preinstalled on the external device, or a user of the external device may download the program from a server providing an application for installation. The server providing an application may include a recording medium having the program recorded thereon.

According to exemplary embodiments, when an image is obtained by using a multi-echo pulse sequence in which an echo time is sequentially changed in each TR, a sharp change in echo times of a plurality of items of data in a k-space may not occur.

According to exemplary embodiments, it is possible to reduce artifacts occurring due to different phase components of MR signals by preventing a sharp change in echo times of a plurality of items of data in a k-space when an image is obtained by using a multi-echo pulse sequence.

Exemplary embodiments may be implemented through non-transitory computer-readable recording media having recorded thereon computer-executable instructions and data. The instructions may be stored in the form of program codes, and when executed by a processor, generate a predetermined program module to perform a specific operation. Furthermore, when being executed by the processor, the instructions may perform specific operations according to the exemplary embodiments.

While one or more exemplary embodiments have been described with reference to the figures, it will be understood by one of ordinary skill in the art that various changes in form and details may be made therein without departing from the spirit and scope of the present disclosure as defined by the following claims. Accordingly, the above exemplary embodiments and all aspects thereof are examples only and are not limiting.

What is claimed is:

1. A magnetic resonance imaging (MRI) apparatus for obtaining a magnetic resonance (MR) image using a multi-echo pulse sequence comprising a plurality of repetition times, the MRI apparatus comprising:
a memory configured to store an MR signal obtained using the multi-echo pulse sequence; and
an image processor configured to determine a plurality of echo times included in the plurality of repetition times to provide the multi-echo pulse sequence comprising the plurality of echo times during the plurality of repetition times, and to obtain the MR image, based on the MR signal,
wherein the plurality of repetition times includes a first repetition time adjacent to a second repetition time,
wherein the plurality of echo times includes a first echo time of the first repetition time, a second echo time of the first repetition time, a first echo time of the second repetition time, and a second echo time of the second repetition time,
wherein at least one of a value of the first echo time of the first repetition time is different from a value of the first echo time of the second repetition time, or a value of the second echo time of the first repetition time is different from a value of the second echo time of the second repetition time, and
wherein a first difference between the value of the first echo time of the first repetition time and the value of the second echo time of the first repetition time, is different from a second difference between the value of the first echo time of the second repetition time and the value of the second echo time of the second repetition time.

2. The MRI apparatus of claim 1, wherein the image processor is further configured to determine the plurality of echo times by using a differential formula.

3. The MRI apparatus of claim 2, wherein the differential formula corresponds to a function of a value of a phase encoding axis in a k-space.

4. The MRI apparatus of claim 1, wherein the image processor is further configured to:
determine a flat period comprising a time period in which the first echo time of the first repetition time equals the first echo time of the second repetition time, or the second echo time of the first repetition time equals the second echo time of the second repetition time, and
determine a transition period comprising a time period in which the first echo time of the first repetition time is different from the first echo time of the second repetition time, and the second echo time of the first repetition time is different from the second echo time of the second repetition time.

5. The MRI apparatus of claim 1, wherein
the plurality of repetition times correspond to a value of a phase encoding axis in a k-space, and
the image processor is further configured to determine the plurality of echo times to be sequentially increased or decreased according to a sequential increase in the value of the phase encoding axis.

6. The MRI apparatus of claim 5, wherein the image processor is further configured to determine the plurality of echo times to have irregular periods with respect to the sequential increase or decrease in the plurality of echo times.

7. The MRI apparatus of claim 1, wherein the multi-echo pulse sequence comprising the plurality of repetition times further comprises at least one of a gradient echo sequence, a spin echo sequence, a fast spin echo sequence, and a gradient- and spin-echo (GRASE) sequence.

8. The MRI apparatus of claim 1, wherein
first k-space data corresponding to the first echo time of the first repetition time or the first echo time of the second repetition time corresponds to a low frequency domain in a k-space, and
second k-space data corresponding to the second echo time of the first repetition time or the second echo time of the second repetition time corresponds to a high frequency domain in the k-space.

9. The MRI apparatus of claim 8, wherein the image processor is further configured to change a length of an echo time of the plurality of echo times by controlling an intensity of a readout gradient applied to a time period corresponding to the echo time.

10. A method of obtaining a magnetic resonance (MR) image by using a multi-echo pulse sequence comprising a plurality of repetition times, the method comprising:
determining a plurality of echo times included in the plurality of repetition times;
providing the multi-echo pulse sequence comprising the plurality of echo times during the plurality of repetition times; and
obtaining the MR image, based on an MR signal obtained by using the multi-echo pulse sequence,
wherein the plurality of repetition times includes a first repetition time adjacent to a second repetition time,
wherein the plurality of echo times includes a first echo time of the first repetition time, a second echo time of the first repetition time, a first echo time of the second repetition time, and a second echo time of the second repetition time, wherein at least one of a value of the first echo time of the first repetition time is different from a value of the first echo time of the second repetition time, or a value of the second echo time of the first repetition time is different from a value of the second echo time of the second repetition time, and wherein a first difference between the value of the first echo time of the first repetition time and the value of the second echo time of the first repetition time, is different from a second difference between the value of the first echo time of the second repetition time and the value of the second echo time of the second repetition time.

11. The method of claim 10, wherein the determining comprises determining the plurality of echo times by using a differential formula.

12. The method of claim 11, wherein the differential formula corresponds to a function of a value of a phase encoding axis in a k-space.

13. The method of claim 10, further comprising:
determining a flat period comprising a time period in which the first echo time of the first repetition time equals the first echo time of the second repetition time, or the second echo time of the first repetition time equals the second echo time of the second repetition time, and determining a transition period comprising a time period in which the first echo time of the first repetition time is different from the first echo time of the second repetition time, and the second echo time of the first repetition time is different from the second echo time of the second repetition time.

14. The method of claim 10, wherein
the plurality of repetition times correspond to a value of a phase encoding axis in a k-space, and
the determining comprises determining the plurality of echo times to be sequentially increased or decreased according to a sequential increase in the value of the phase encoding axis.

15. The method of claim 14, wherein the determining comprises determining the plurality of echo times to have irregular periods with respect to the sequential increase or decrease in the plurality of echo times.

16. The method of claim 10, wherein the multi-echo pulse sequence comprising the plurality of repetition times further comprises at least one of a gradient echo sequence, a spin echo sequence, a fast spin echo sequence, and a gradient- and spin-echo (GRASE) sequence.

17. The method of claim 10, wherein
first k-space data corresponding to the first echo time of the first repetition time or the first echo time of the second repetition time corresponds to a low frequency domain in a k-space, and
second k-space data corresponding to the second echo time of the first repetition time or the second echo time of the second repetition time corresponds to a high frequency domain in the k-space.

18. A non-transitory computer-readable recording medium having recorded thereon a program for executing the method of claim 10.

19. A method of obtaining a magnetic resonance (MR) image by using a multi-echo pulse sequence comprising a plurality of repetition times, the method comprising:
determining a plurality of echo times included in the plurality of repetition times;
providing the multi-echo pulse sequence comprising the plurality of echo times during the plurality of repetition times; and
obtaining the MR image, based on an MR signal obtained by using the multi-echo pulse sequence,
wherein the plurality of repetition times includes a first repetition time adjacent to a second repetition time,
wherein the first repetition time includes a first echo time and a second echo time, and the second repetition time includes a third echo time and a fourth echo time,
wherein at least one of a value of the first echo time is different from a value of the third echo time, or a value of the second echo time is different from a value of the fourth echo time, and
wherein a first difference between the value of the first echo time and the value of the second echo time, is different from a second difference between the value of the third echo time and the value of the fourth echo time.

20. The MRI apparatus of claim 1, wherein the value of the first echo time of the first repetition time is different from the value of the second echo time of the first repetition time, and the value of the first echo time of the second repetition time is different from the value of the second echo time of the second repetition time, time.

* * * * *